(12) United States Patent
Lin et al.

(10) Patent No.: US 11,456,211 B2
(45) Date of Patent: Sep. 27, 2022

(54) METHOD OF FORMING INTERCONNECT STRUCTURE

(71) Applicant: Taiwan Semiconductor Manufacturing Co., Ltd., Hsinchu (TW)

(72) Inventors: Bo-Jiun Lin, Hsinchu County (TW); Tung-Ying Lee, Hsinchu (TW); Yu-Chao Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/942,789

(22) Filed: Jul. 30, 2020

(65) Prior Publication Data

US 2022/0037202 A1 Feb. 3, 2022

(51) Int. Cl.
*H01L 21/768* (2006.01)

(52) U.S. Cl.
CPC .... *H01L 21/76834* (2013.01); *H01L 21/7684* (2013.01); *H01L 21/76805* (2013.01); *H01L 21/76843* (2013.01); *H01L 21/76874* (2013.01); *H01L 21/76879* (2013.01)

(58) Field of Classification Search
CPC ......... H01L 21/76841; H01L 21/76843; H01L 21/76844; H01L 21/76847; H01L 21/76852; H01L 21/76834; H01L 21/76829; H01L 21/76801; H01L 21/76871; H01L 21/76874; H01L 21/76831; H01L 21/76849
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2004/0087148 A1* | 5/2004 | Wong | H01L 21/76855 438/687 |

(Continued)

*Primary Examiner* — Thanhha S Pham
(74) *Attorney, Agent, or Firm* — JCIPRNET

(57) ABSTRACT

Provided is a method of forming an interconnect structure including: forming a via; forming a first barrier layer to at least cover a top surface and a sidewall of the via; forming a first dielectric layer on the first barrier layer; performing a planarization process to remove a portion of the first dielectric layer and a portion of the first barrier layer, thereby exposing the top surface of the via; forming a second dielectric layer on the first dielectric layer, wherein the second dielectric layer has an opening exposing the top surface of the via; forming a blocking layer on the top surface of the via; forming a second barrier layer on the second dielectric layer; removing the blocking layer to expose the top surface of the via; and forming a conductive feature in the opening, wherein the conductive feature is in contact with the top surface of the via.

20 Claims, 12 Drawing Sheets

(56) References Cited

U.S. PATENT DOCUMENTS

2004/0142561 A1* 7/2004 Wu .................. H01L 21/76885
                                                    438/687
2012/0080792 A1* 4/2012 Zhao ................ H01L 23/53295
                                                    257/751
2020/0144107 A1* 5/2020 Dutta ............... H01L 23/53238

* cited by examiner

METHOD OF FORMING INTERCONNECT STRUCTURE

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance, which presents performance, yield, and cost challenges. It has been observed that higher contact resistances exhibited by interconnects in advanced IC technology nodes can significantly delay signals from being routed efficiently to and from IC devices, such as transistors, negating any improvements in performance of such IC devices in the advanced technology nodes. Accordingly, interconnects still face many challenges to solve.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 13 are cross-sectional views of a method of forming a semiconductor device in accordance with an embodiment.

DETAILED DESCRIPTION

Figure 1:
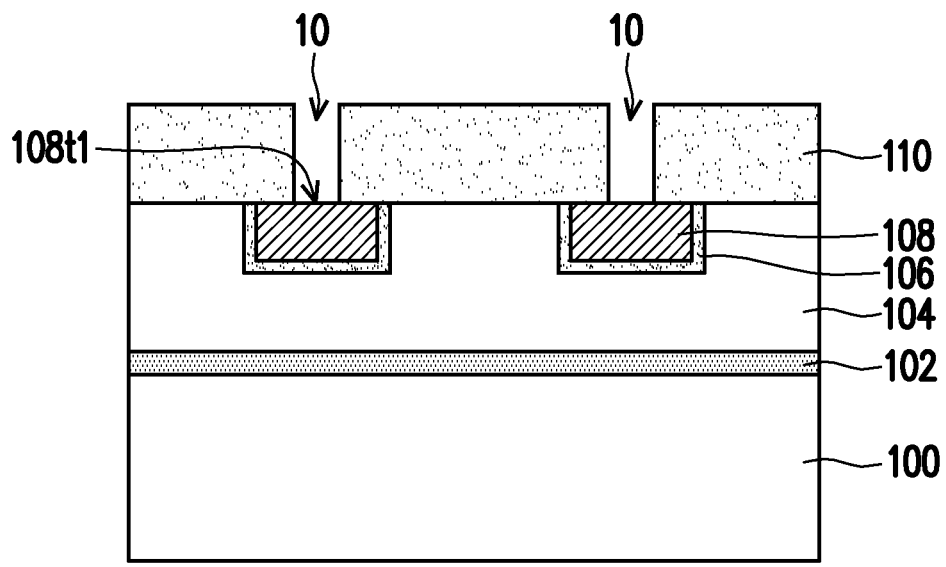

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, BEOL processes are experiencing significant challenges. For example, advanced IC technology nodes require more compact MLI features, which requires significantly reducing critical dimensions of interconnects of the MLI features (for example, widths and/or heights of vias and/or conductive lines of the interconnects). The reduced critical dimensions have led to significant increases in interconnect resistance, which can degrade IC device performance (for example, by increasing resistance-capacitance (RC) delay). Conventional dual damascene structure includes a conductive feature, a via, and a barrier layer. The conductive feature is disposed on the via. The barrier layer is lined the sidewalls of the conductive feature and the via, and the bottom surface of the via. The barrier layer disposed between the bottom surface of the via and the underlying interconnect feature (such as a device-level contact or a conductive line) increases the contact resistance there-between, thereby degrading the device performance.

In accordance with some embodiments, the via is formed by an electroless plating process to be in direct contact with the underlying conductive feature. That is, the contact interface between the via and the underlying conductive feature is free of any barrier material, thereby decreasing the contact resistance between the via and the underlying conductive feature. In addition, the top surface of the via is covered by the blocking layer during forming the upper barrier layer. After removing the blocking layer, the subsequently formed overlying conductive feature may be in direct contact with the top surface of the via, thereby further decreasing the contact resistance between the via and the overlying conductive feature. In the case, the interconnect structure including the via connected to the overlying and underlying conductive features may have a better RC performance to efficiently transit signals.

FIG. 1 to FIG. 13 are cross-sectional views of a method of forming a semiconductor device in accordance with an embodiment. FIG. 3A to FIG. 3F are cross-sectional views showing a via in accordance with various embodiments. FIG. 6B and FIG. 6C are enlarged cross-sectional views showing a structure of FIG. 6A in accordance with various embodiments.

Referring to FIG. 1, an initial structure is provided to include a substrate 100, a device region 102, a dielectric layer 104, a barrier layer 106, and a conductive feature 108. In some embodiments, the substrate 100 is a semiconductor substrate, such as a bulk semiconductor, a semiconductor-on-insulator (SOI) substrate, or the like. The substrate 100 may be doped (e.g., with a p-type or an n-type dopant) or undoped. The substrate 100 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 102 is disposed on the substrate 100 in a front-end-of-line (FEOL) process. The device region 102 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 102 includes a gate structure, source and drain regions, and isolation structures such as shallow trench isolation (STI) structures (not shown). In the device region 102, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 100. The functions of the devices may include memory, processors, sensors, amplifiers, power distribution, input/output circuitry, or the like.

The dielectric layer 104 may be disposed on the device region 102, so that the device region 102 may be disposed between the substrate 100 and the dielectric layer 104. In some embodiments, the dielectric layer 104 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 104 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the dielectric layer 104 include one or more dielectric materials. In some embodiments, the dielectric layer 104 is formed to a suitable thickness by FCVD, PECVD, HDPCVD, SACVD, spin-on, sputtering, or other suitable methods.

The barrier layer 106 and the conductive feature 108 may be embedded in the dielectric layer 104. As shown in FIG. 1, the barrier layer 106 lines a sidewall and a bottom surface of the conductive feature 108. The conductive feature 108 may include a seed layer and a conductive layer on the seed layer. The seed layer may be a metal layer, which may be a single layer or a composite layer including a plurality of sub-layers formed of different materials. For example, the seed layer is a titanium/copper composited layer. The conductive layer may include metal, such as Al, Cu, W, Co, Pd, Pt, Ni, other low resistivity metal constituent, an alloy thereof, or a combination thereof, and are formed by an electroplating process. The barrier layer 106 may separate the conductive feature 108 from the dielectric layer 104 and prevent the metal atoms (e.g., Cu, Co, W, or Al atoms) of the conductive feature 108 from diffusing into the dielectric layer 104. The barrier layer 106 may include Ti, TiN, Ta, TaN, an alloy thereof, or a combination thereof. In some embodiments, the barrier layer 106 and the conductive feature 108 are formed by a single damascene process, which includes performing a lithography and etching process to form a trench in the dielectric layer 104, lining the trench with a barrier material, filling the trench with a conductive material, and performing a planarization process to remove excess the conductive and barrier materials, so that the barrier layer 106, the conductive feature 108, and the dielectric layer 104 have substantially planar surfaces.

After forming the conductive feature 108, a mask pattern 110 is formed on the dielectric layer 104. As shown in FIG. 1, the mask pattern 110 has a via opening 10 exposing a portion of a top surface 108t1 of the conductive feature 108. In some embodiments, the mask pattern 110 includes photoresist, such as a positive photoresist or a negative photoresist, and may be formed by any suitable method, such as spin-coating.

Figure 2:
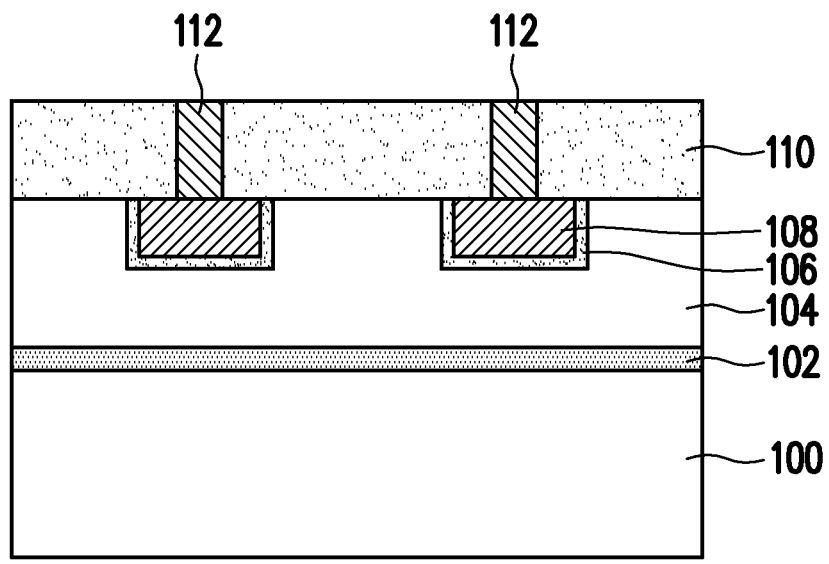

Referring to FIG. 2, by using an electroless plating process, a via 112 is formed in the via opening 10 with a conductive material. In some embodiments, the structure illustrated in FIG. 1 is immersed into a chemical tank containing an electrolyte. A selective deposition, such as electroless plating, may be performed in the chemical tank and the via 112 thus be selectively formed on the conductive feature 108 through a chemical reaction, such as ion reduction or ion replacement, without additional power supplied by an anode and a cathode, as is required in conventional electroplating. Specifically, the via 112 may be selectively formed on the exposed surface 108t1 of the conductive feature 108 (as shown in FIG. 1) due to the metal surface provide an electron transfer path for the metal reduction. On the other hands, since the dielectric surface has no electron transfer path for the metal reduction, no via is formed on the dielectric layer 104 or the mask pattern 110. That is to say, even if the opening 10 is offset from the conductive feature 108 and exposes a portion of the dielectric layer 104, the via 112 is only formed on the conductive feature 108 and not on the dielectric layer 104. In some embodiments, the electrolyte adopted in the electroless plating process for forming the via 112 includes at least metal ions; catalysts such as Pd, Ni, Pt, or Co; reducing agents such as sodium hypophosphite, formaldehyde, DEAB (n-diethylamine borane), sodium borohydride or hydrazine; and complex agents such as EDTA, salts of tartaric acid or TEA (triethanolamine). Further, other agents such as stabilizer, buffer solution of predetermined metal ion, wetting agent or brightener can be further included in the electrolyte to enhance the efficiency of the electroless plating. The metal ions in the electrolyte may be ions of cobalt (Co), copper (Cu), gold (Au), tantalum (Ta), titanium (Ti), platinum (Pt), tungsten (W), nickel (Ni), palladium (Pd), or the like.

Figure 3A:
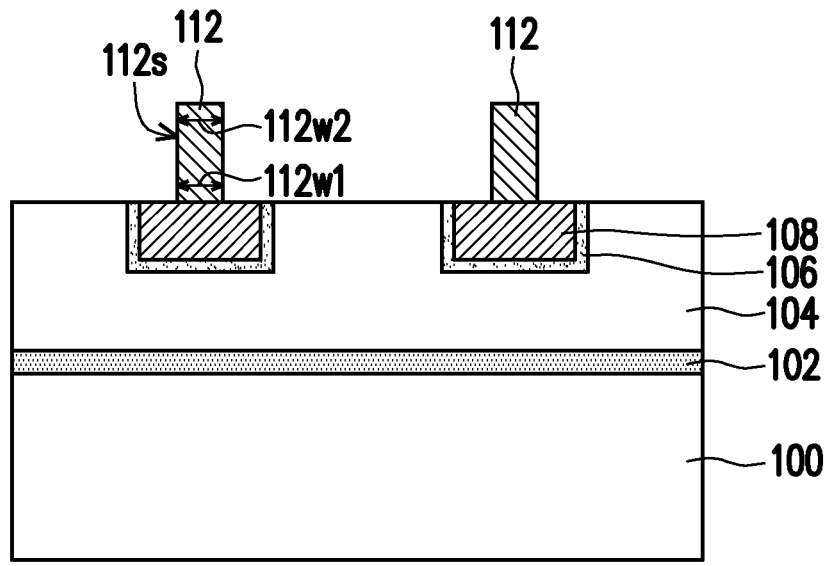
FIG. 3A to FIG. 3F are cross-sectional views showing a via in accordance with various embodiments.
Figure 3B:
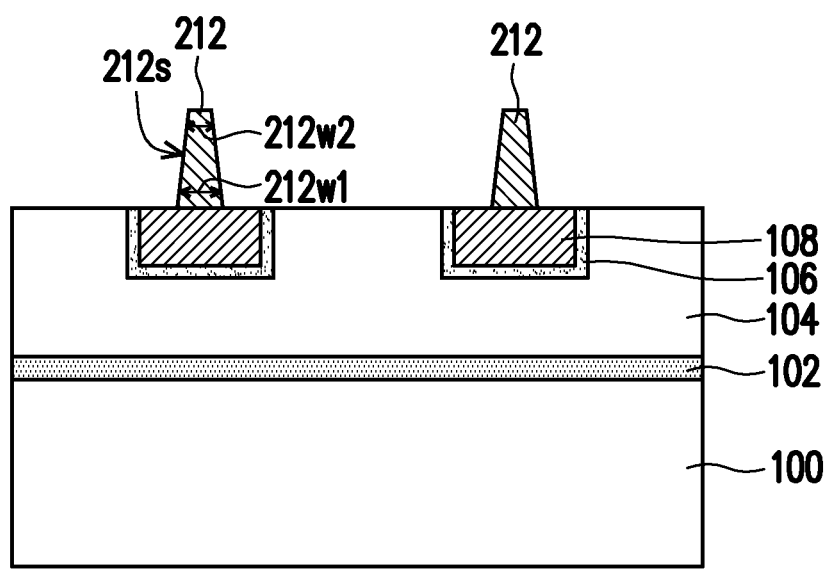
Figure 3C:
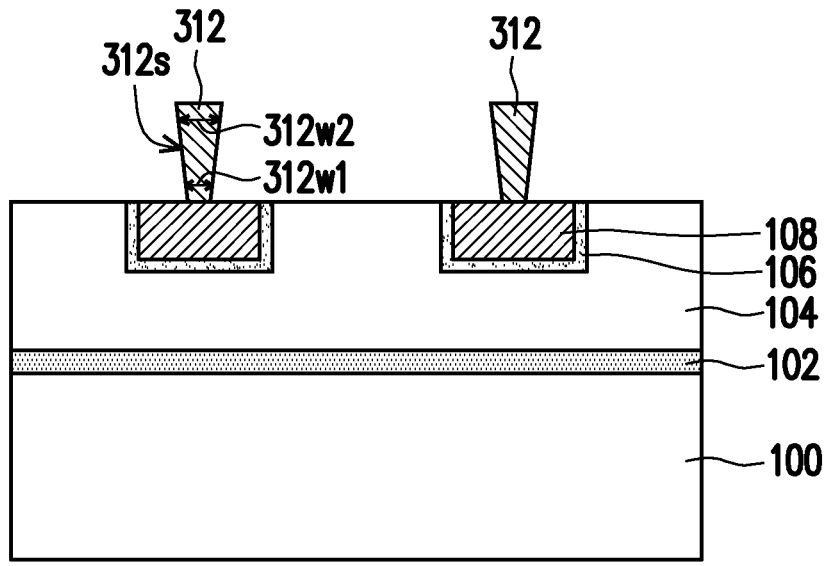

Referring to FIG. 3A, after removing the mask pattern 110, the via 112 is exposed. In some embodiments, the via 112 has a bottom width 112w1 substantially equal to a top width 112w2. That is, the via 112 has a sidewall 112s perpendicular to the top surface 108t1 of the conductive feature 108 (as shown in FIG. 1). In the present embodiment, the bottom width 112w1 and the top width 112w2 are less than 30 nm, such as 29 nm, 28 nm, 27 nm, 26 nm, 25 nm, etc. However, the embodiments of the present disclosure are not limited thereto. In other embodiments, the shape and configuration of the via may be adjusted according to need. For example, as shown in FIG. 3B, a via 212 has a bottom width 212w1 greater than a top width 212w2. That is, the via 212 has a tapered sidewall 212s along a direction from the top surface of the substrate 100 upward. In addition, as shown in FIG. 3C, a via 312 may have a bottom width 312w1 less than a top width 312w2. That is, the via 312 has a V-shaped sidewall 312s which is tapered along a direction from a top surface of the via 312 downward. Although only three different shapes of the via are illustrated in FIG. 3A to FIG. 3C, the shapes of the via may vary according to the opening 10 of the FIG. 1. For example, the sidewall of the via may be uneven, such as wavy or zigzag.

Figure 3D:
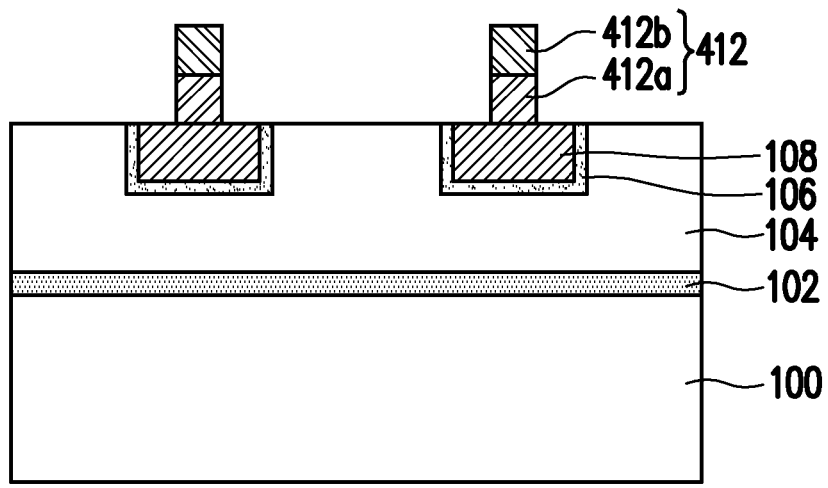
Figure 3E:
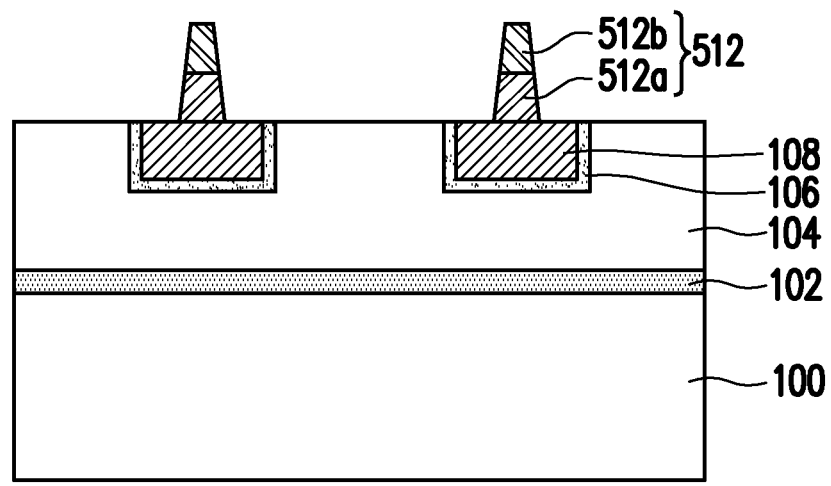
Figure 3F:
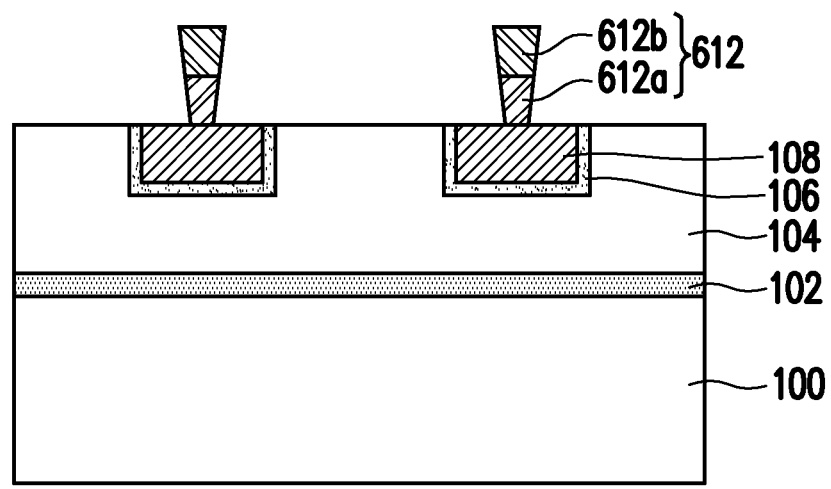

In addition to changes in shape of the via, the via may also have different configurations. As shown in FIG. 3D, a shape of a via 412 is similar to a shape of the via 112, and thus the details are omitted herein. The main difference there-between lies in that the via 412 includes a lower portion 412a and an upper portion 412b with different conductive materials, while the via 112 has the same conductive material. For example, the lower portion 412a is made of Cu and the upper portion 412b is made of Co, while the via 112 is made of Co. In some embodiments, the via 412 is formed by forming a first conductive material in the via opening 10 (as shown in FIG. 1) by using a first electroless plating process, and forming a second conductive material on the first conductive material by using a second electroless plating process. Built on the basis, the via 412 may be formed by three portions with three different conductive materials, such as Co/Ni/Cu or the like. In other words, the via 412 including a multi-layer structure with more than three different conductive materials is also the scope of the present disclosure. In addition, as shown in FIG. 3E, a shape of a via 512 is similar to a shape of the via 212, and thus the details are omitted herein. The main difference there-between lies in that the via 512 includes a lower portion 512a and an upper portion 512b with different conductive materials, while the via 212 has the same conductive material. In alternative embodiments, the via 512 also include a multi-layer structure with more than two different conductive materials. Further, as shown in FIG. 3F, a shape of a via 612 is similar to a shape of the via 312, and thus the details are omitted herein. The main difference there-between lies in that the via 612 includes a lower portion 612a and an upper portion 612b with different conductive materials, while the via 312 has the same conductive material. In alternative embodiments, the via 612 also include a multi-layer structure with more than two different conductive materials.

Any one of the vias 112, 212, 312, 412, 512, and 612 may be used to perform the subsequent process steps. Hereinafter, the via 112 shown in FIG. 3A is used as an example to illustrate the subsequent process step.

Figure 4:
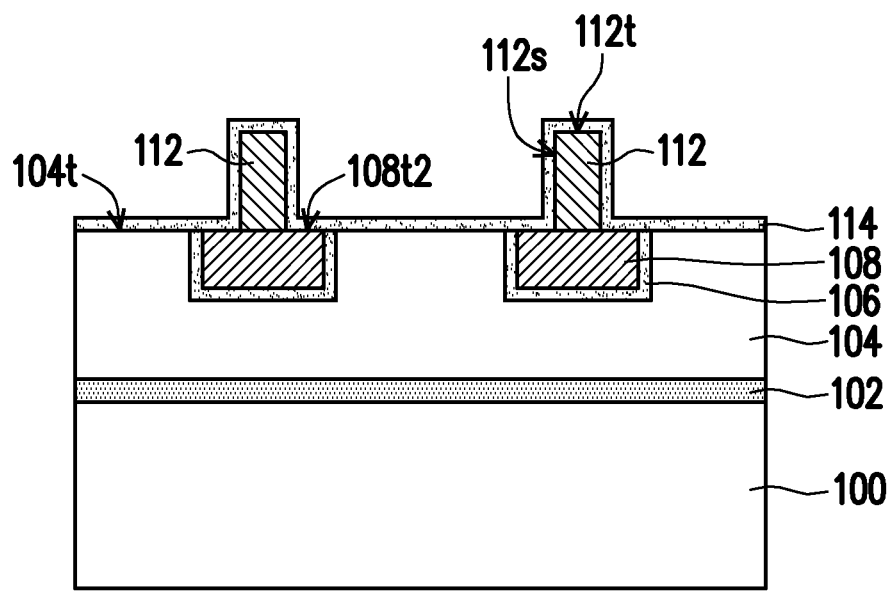

Referring back to FIG. 4, after exposing the via 112, a barrier material 114 is formed on the via 112 by using an atomic layer deposition (ALD) process. The barrier material 114 may conformally cover a top surface 104t of the dielectric layer 104, another portion of the top surface 108t2 of the conductive 108, and the sidewall 112s and a top surface 112t of the via 112. As shown in FIG. 4, the barrier material 114 continuously extends between two adjacent vias 112. In some embodiments, the barrier material 114 includes Ti, TiN, Ta, TaN, or a combination thereof, and has a thickness less than 10 nm. The barrier material 114 and the barrier layer 106 may have the same material or different materials and may have the same thickness or different thicknesses.

Figure 5:
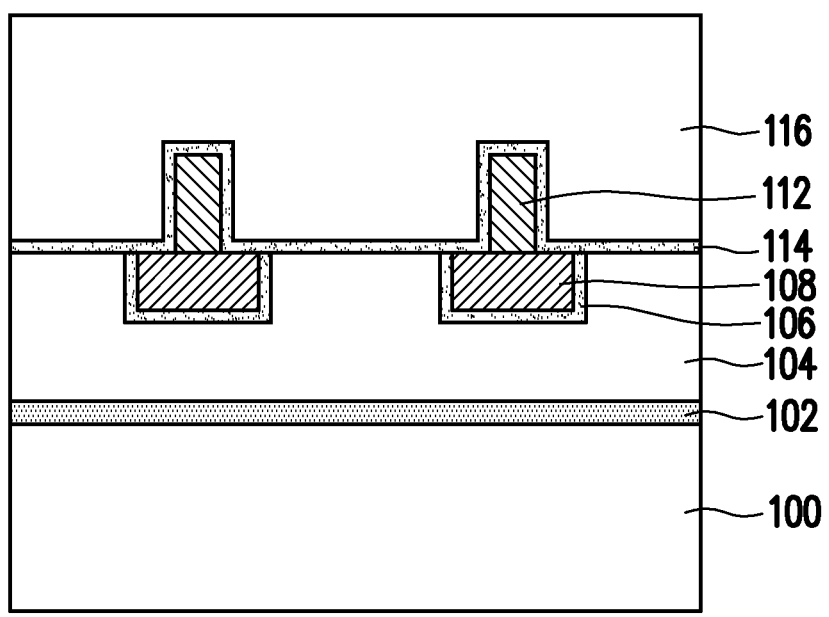

Referring to FIG. 5, a dielectric material 116 is formed on the barrier material 114. In some embodiments, the dielectric material 116 includes silicon oxide, silicon nitride, silicon oxynitride, a spin-on dielectric material, or a low-k dielectric material, and is formed to a suitable thickness by FCVD, PECVD, HDPCVD, SACVD, spin-on, sputtering, or other suitable methods. The dielectric material 116 and the dielectric layer 104 may have the same dielectric material or different dielectric materials.

Figure 6A:
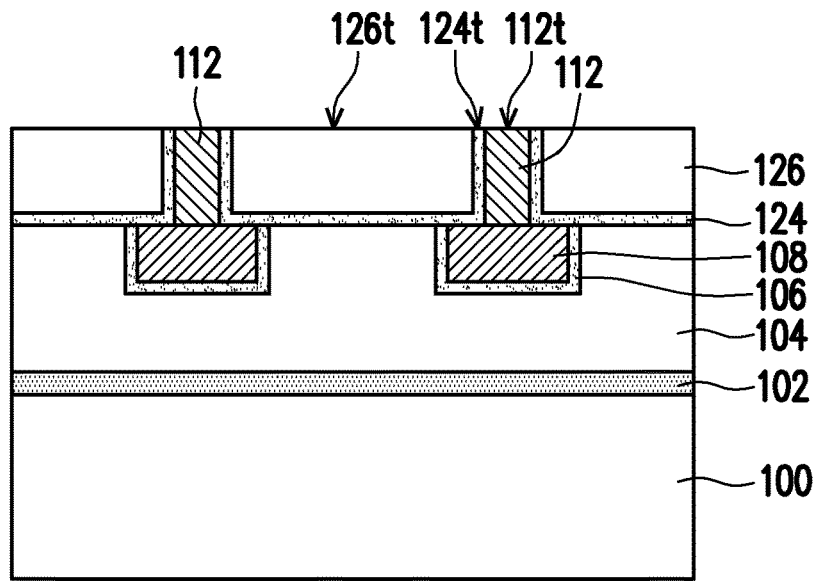
Figure 6B:
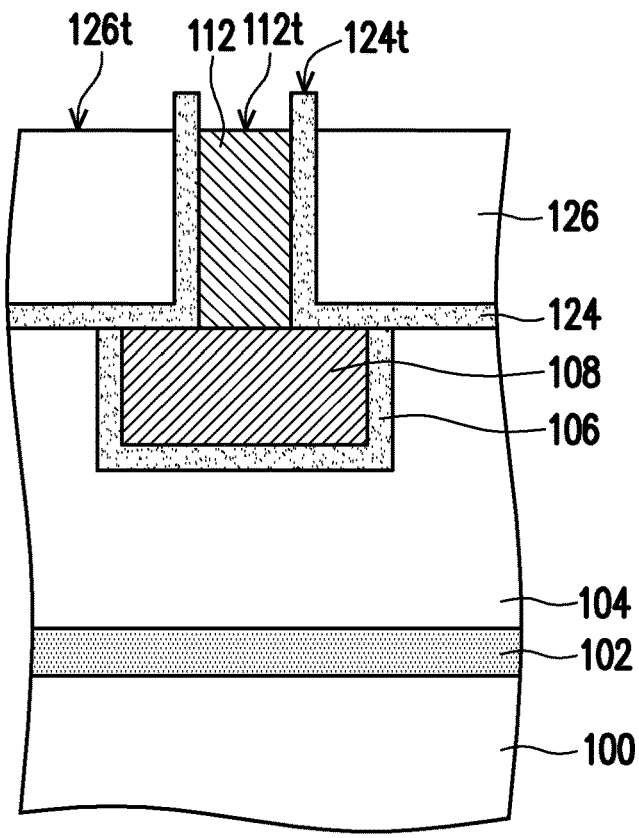
FIG. 6B and FIG. 6C are enlarged cross-sectional views showing a structure of FIG. 6A in accordance with various embodiments.
Figure 6C:
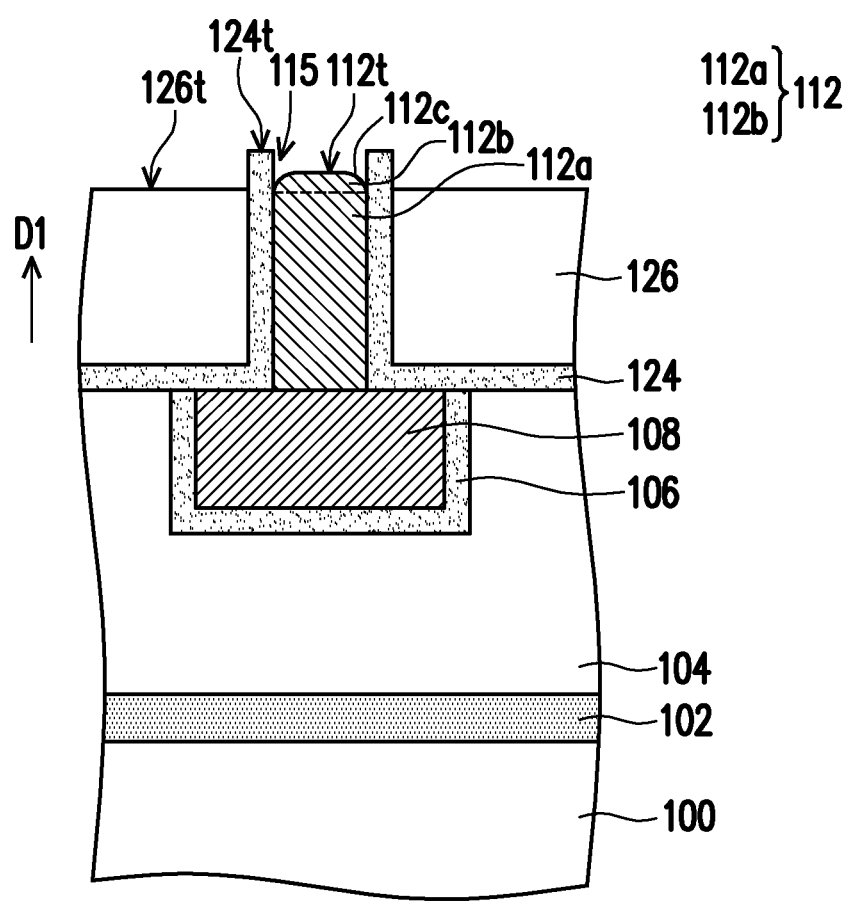

Referring to FIG. 6A, a first planarization process (e.g., a chemical mechanical polishing (CMP) process) is performed to remove a portion of the dielectric material 116 and a portion of the barrier material 114, thereby exposing the top surface 112t of the via 112. In the case, a dielectric layer 126 is formed to laterally wrap or surround the via 112, and a barrier layer 124 is formed between the dielectric layer 126 and the via 112. In some embodiments, the top surface 112t of the via 112 is flush with a top surface 124t of the barrier layer 124 and a top surface 126t of the dielectric layer 126. However, the embodiments of the present disclosure are not limited thereto. In other embodiments, as shown in FIG. 6B, the top surface 124t of the barrier layer 124 is higher than the top surface 112t of the via 112 and the top surface 126t of the dielectric layer 126 due to the removing rate of the dielectric material 116 greater than the removing rate of the barrier material 114 during the first planarization process. In addition, the top surface 124t of the barrier layer 124 may be flush with or lower than the top surface 112t of the via 112. In some alternative embodiments, as shown in FIG. 6C, the via 112 has a bottom portion 112a and a top portion 112b on the bottom portion 112a. A corner 112c of the top portion 112b is bent away from the barrier layer 124, so as to form a recess 115 between the top portion 112b of the via 112 and the barrier layer 124. In other words, the top portion 112b of the via 112 has a tapered or inclined sidewall. The tapered or inclined sidewall may be curved or straight. As shown in FIG. 6C, a horizontal cross-sectional area of the top portion 112b of the via 112 gradually decreases in a direction D1 from a bottom portion 112a to the top portion 112b. The direction D1 is substantially perpendicular to the top surface of the substrate 100. That is, a horizontal cross-sectional area of a top surface of the top portion 112b is less than a horizontal cross-sectional area of a bottom surface of the top portion 112b. In the present embodiment, the top surface 112t of the via 112 may be higher than the top surface 126t of the dielectric layer 126, and lower than the top surface 124t of the barrier layer 124. Alternatively, the top surface 112t of the via 112 may be flush with the top surface 126t of the dielectric layer 126, and lower than the top surface 124t of the barrier layer 124. Further, the top surface 124t of the barrier layer 124 may be flush with or lower than the top surface 112t of the via 112.

Figure 7:
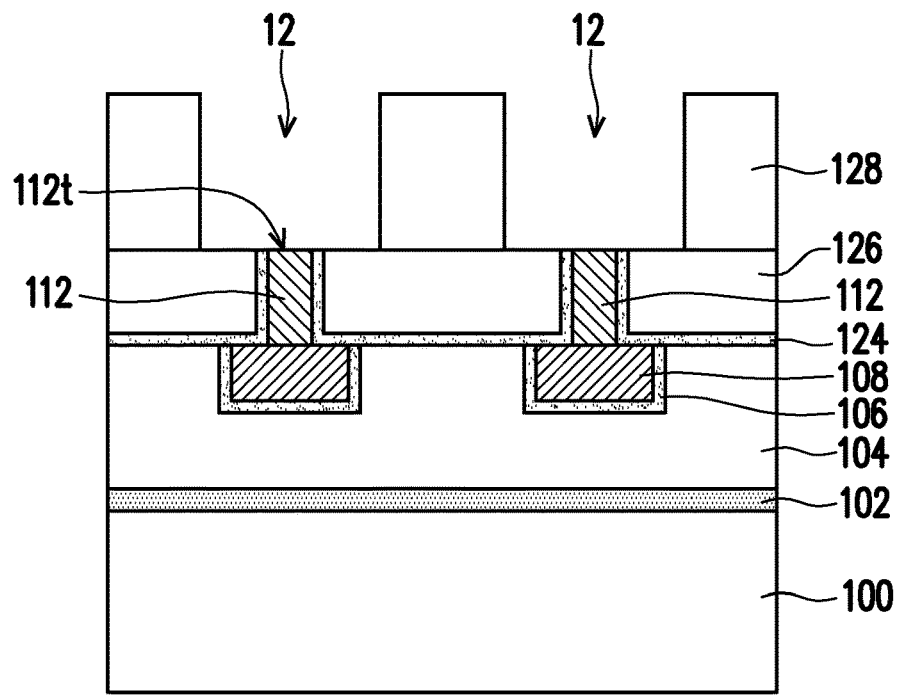

Referring to FIG. 7, a dielectric layer 128 is formed on the dielectric layer 126. The dielectric layer 128 may have a trench or opening 12 exposing the top surface 112t of the via 112 and a portion of the dielectric layer 126. In some embodiments, the dielectric layer 128 includes a dielectric material, such as silicon oxide, silicon nitride, silicon oxynitride, a spin-on dielectric material, or a low-k dielectric material, and is formed to a suitable thickness by FCVD, PECVD, HDPCVD, SACVD, spin-on, sputtering, or other suitable methods. The dielectric layer 128 and the dielectric layer 104 may have the same dielectric material or different dielectric materials.

Figure 8:
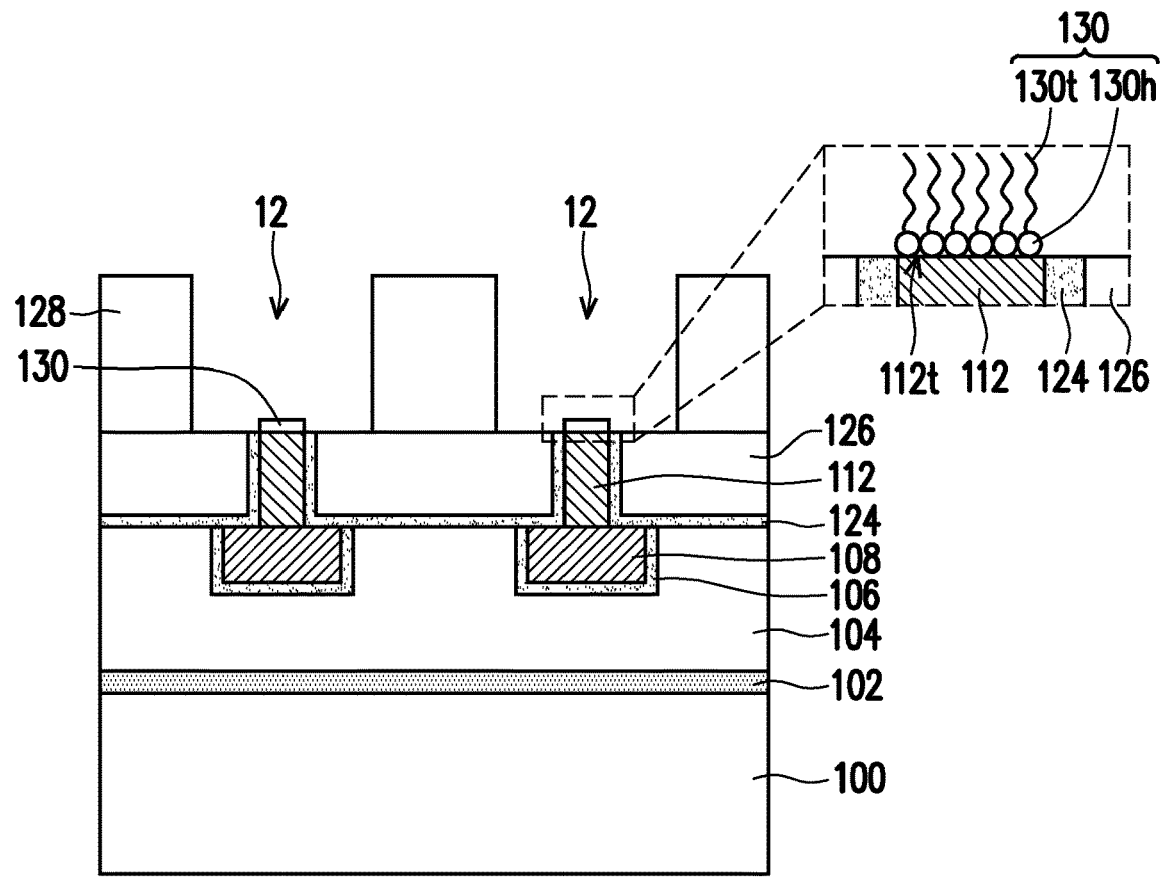

Referring to FIG. 8, a blocking layer 130 is formed on the top surface 112t of the via 112. As shown in the enlarged view of a region of FIG. 8, the blocking layer 130 may include a self-assembled monolayer (SAM) 130, which has a head group 130h and a tail group 130t connected to each other. The head group 130h shows a specific affinity for the material of the via 112, thus the head group 130h is adsorbed onto the top surface 112t of the via 112. In some embodiments, the head group 130h includes a silane group, a phosphonate group, an amine group, a thiol group, a disulfide group, a carboxyl group, the like, or a combination thereof. The tail group 130t may include an alkyl chain, such as a liner alkyl chain or a branched alkyl chain. The carbon chain length (C—C)n of the alkyl chain may be adjustable to define critical dimension of the SAM 130, for example, to increase or decrease a thickness of the SAM 130. In some embodiments, the SAM 130 includes n-alkanethiols (e.g., dodecanethiol, octadecanethiol (ODT), or the like), aromatic thiols (e.g., benzenethiol), phosphonic acid (e.g., octadecylphosphonic acid (ODPA)), n-alkanoic acid (e.g., acetic acid), the like, or a combination thereof.

The SAM 130 may be formed by a vapor deposition process or a liquid deposition process. The SAM 130 may be formed by the chemisorption of the hydrophilic head groups 130h onto the via 112, followed by a slow two-dimensional organization of hydrophobic tail groups 130t. In some embodiments, the adsorption of the SAM 130 may be occurred by immersing the structure shown in FIG. 7 into a dilute solution of an alkane thiol in ethanol. Alternatively, the adsorption of the SAM 130 may also occur from a vapor phase. The adsorbed molecules initially form a disordered mass of molecules, and instantaneously begin to form crystalline or semi-crystalline structures on the via 112 in a monolayer form. The SAM 130 is selectively deposited on the via 112, and not on the exposed dielectric layer 126, 128, and the exposed barrier layer 124 due to the specific affinity of the head group 130h of the SAM 130 to the material of the via 112.

Figure 9:
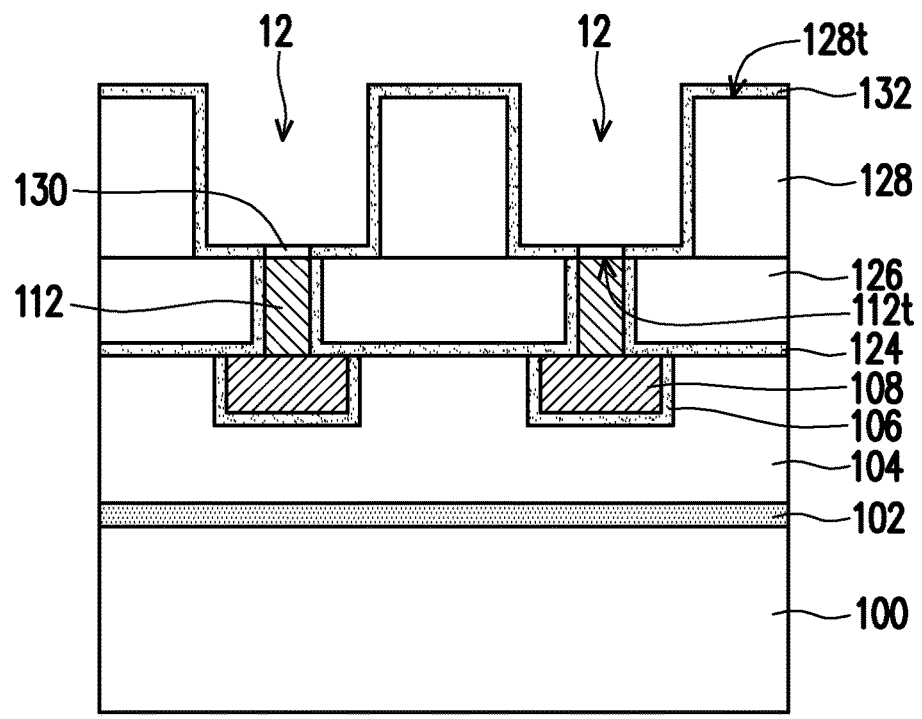

Referring to FIG. 9, a barrier layer 132 is formed on the dielectric layer 128 by using an atomic layer deposition (ALD) process. In some embodiments, the barrier layer 132 includes Ti, TiN, Ta, TaN, or a combination thereof, and has a thickness of less than 10 nm. The overlying barrier layer 132 and the underlying barrier layer 124 may have the same material or different materials and may have the same thickness or different thicknesses. Specifically, the barrier layer 132 may conformally cover a top surface 128t of the dielectric layer 128, the sidewalls of the opening 12, and a portion of the top surface of the dielectric layer 126, thereby connecting the underlying barrier layer 124.

It should be noted that the blocking layer (or SAM) 130 is able to inhibit the growth of the barrier layer 132 for at least 200 ALD cycles. That is, the barrier layer 132 is selectively formed on a region out of the blocking layer 130. In some embodiments, the precursor and/or reaction gas of the ALD process may adsorb on the dielectric layers 126/128 and conduct a reaction to form the barrier layer 132, and the precursor and/or the reaction gas would not adsorb on the blocking layer 130. In some embodiments, the reaction mechanism of the ALD process and the property of the blocking layer 130 makes the barrier layer 132 only deposit on the surfaces of the dielectric layers 126/128, and not deposit on the blocking layer 130 over the via 112. In some embodiments, the molecules of the blocking layer (or SAM) 130 include specially designed functional groups to inhibit the barrier layer 132 deposition thereon. For example, the specially designed functional groups (such as the tail groups 130t shown in FIG. 8) of the SAM 130 may have hydrophobic properties, such as alkyl chain, which would not react with or adsorb the precursor and/or reaction gas used in the deposition process of the barrier layer 132, so as to inhibit the barrier layer 132 depositing on the blocking layer 130 over the via 112. Herein, the blocking layer 130 may be referred to as inhibitor layer.

Figure 10:
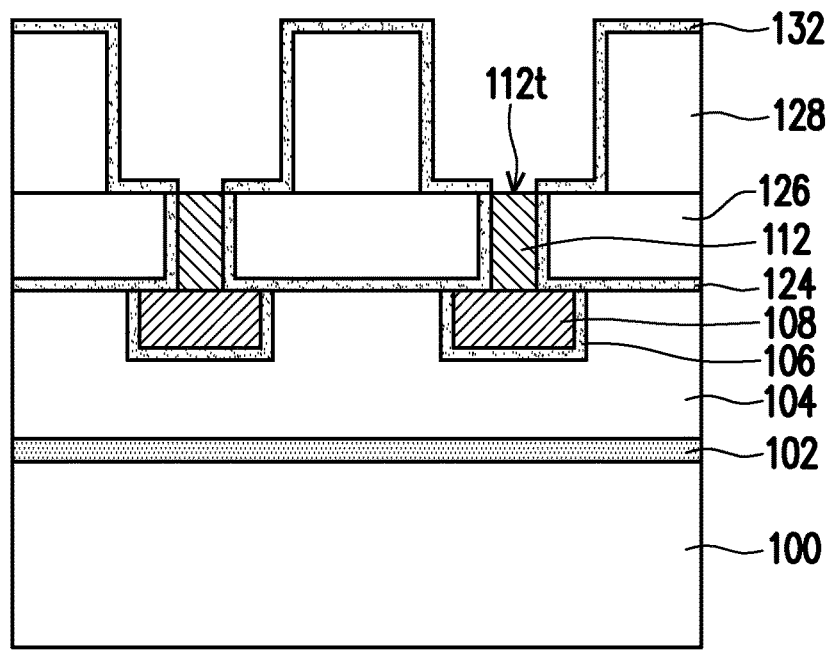

Referring to FIG. 10, the blocking layer 130 is removed to expose the top surface 112t of the via 112 by a removing process. In some embodiments, the removing process includes a plasma process, a thermal process, or a wet etching process. The plasma process may use a suitable plasma, such as $H_2$ plasma, Ar plasma, $N_2$ plasma, $NH_3$ plasma, or the like, to remove the blocking layer 130. The thermal process may bake up to 400° C. The wet etching process may use an etchant of HF, or the like.

Figure 11:
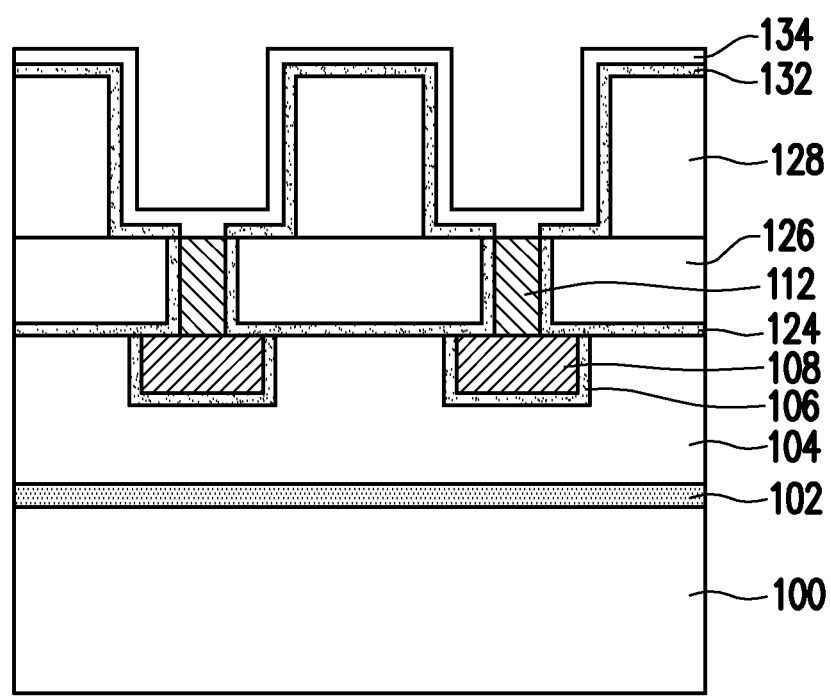
Figure 12:
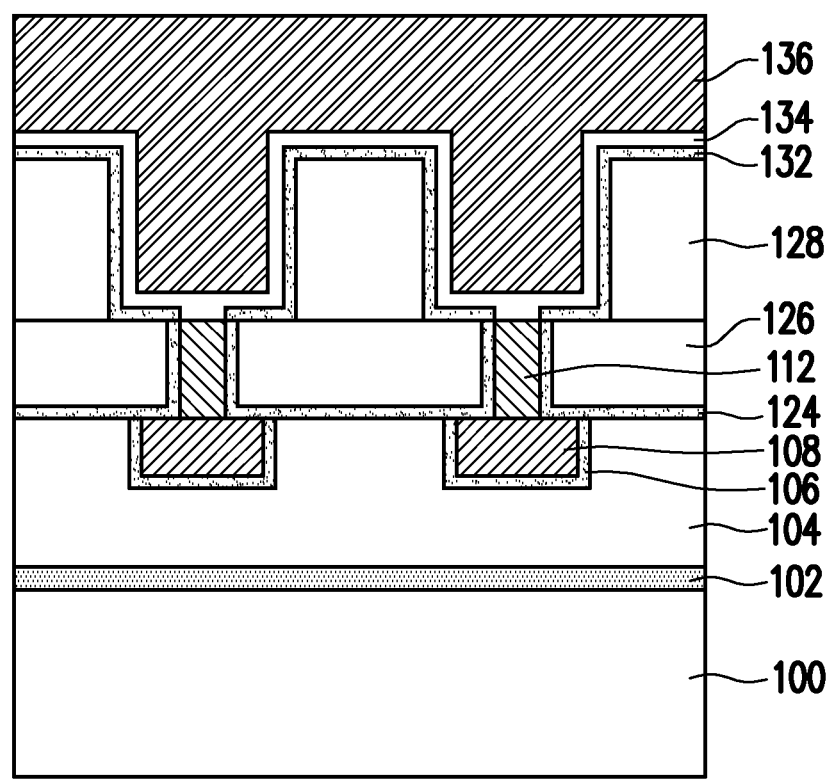
Figure 13:
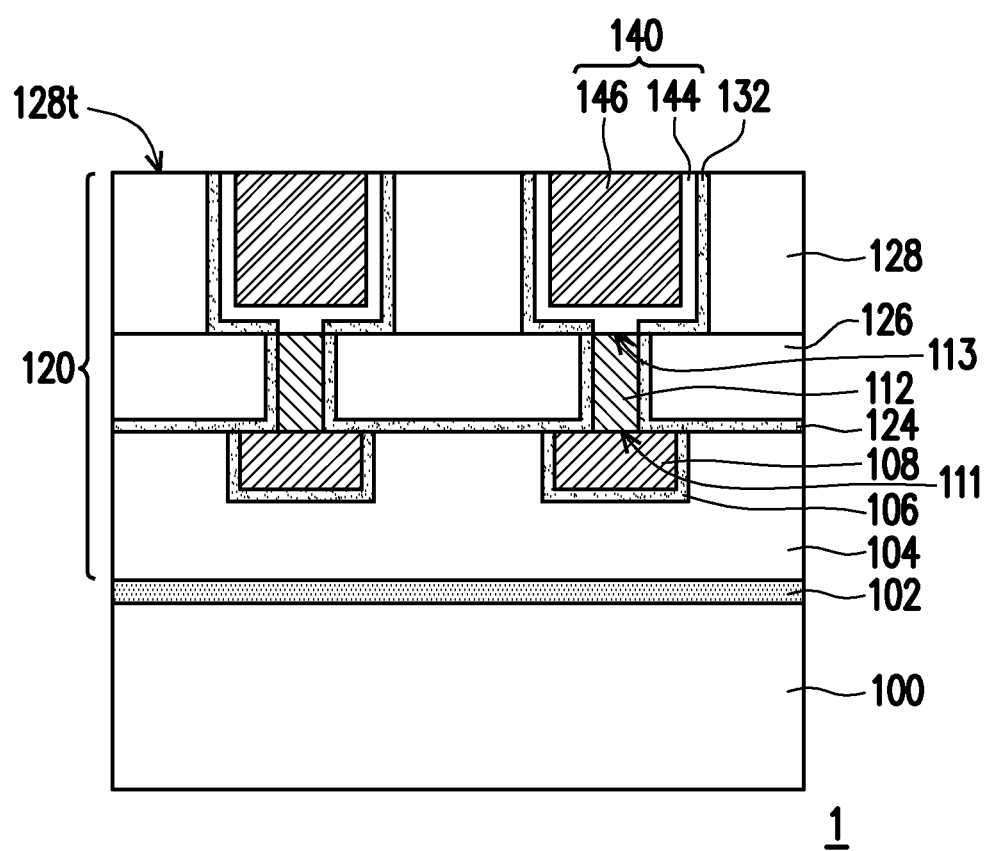

Referring to FIG. 11 to FIG. 13, a conductive feature 140 is formed in the opening 12, so as to accomplish a semiconductor device 1 with an interconnect structure 120. In detail, as shown in FIG. 11, a seed material 134 is formed on the barrier layer 132 and extending to contact the top surface 112t of the via 112. In some embodiments, the seed material 134 is a conformal seed layer. The seed material 134 may be formed by a suitable process, such as CVD or PVD. The PVD may be sputtering, for example. In some embodiments, the seed material 134 is a metal layer, which may be a single layer or a composite layer including a plurality of sub-layers formed of different materials. In other embodiments, the seed material 134 is, for example, a titanium/copper composited layer, wherein the sputtered titanium thin film is in contact with the top surface 112t of the via 112, and the sputtered copper thin film is then formed over the sputtered titanium thin film. In some alternative embodiments, the seed material 134 is other suitable composited layer such as metal, alloy, or a combination thereof.

As shown in FIG. 12, a conductive material 136 is then formed on the seed material 134 to fill up the opening 12 and extend to cover the top surface 128t of the dielectric layer 128. In some embodiments, the conductive material 136 includes metal, such as Al, Cu, W, Co, Pd, Pt, Ni, other low resistivity metal constituent, an alloy thereof, or a combination thereof, and is formed by an electroplating process.

As shown in FIG. 13, a second planarization process is performed to remove a portion of the conductive material 136, a portion of the seed material 134, and a portion of the barrier layer 132, thereby exposing the top surface 128t of the dielectric layer 128. In some embodiments, the second planarization process includes a chemical mechanical polishing (CMP) process or other suitable process. After the second planarization process, the conductive feature 140 is formed on and electrically connected to the via 112. The conductive feature 140 may be a conductive line and may include a seed layer 144 and a conductive layer 146. The seed layer 144 lines a sidewall and a bottom surface of the conductive layer 146.

Referring to FIG. 13, the semiconductor device 1 includes the substrate 100, the device region 102, and the interconnect structure 120. The device region 102 is disposed between the substrate 100 and the interconnect structure 120. The interconnect structure 120 may include the underlying conductive feature 108 (which may be called as first conductive feature), the via 112, and the overlying conductive feature 140 (which may be called as second conductive feature). In some embodiments, the conductive features 108 and 140 are referred to as conductive lines and the via 112 electrically communicates the conductive features 108 and 140 to be referred to as circuit. In other words, the conductive feature 108 may be the metal n-1 (Mn-1), the via 112 may be the via n (Vn), and the conductive feature 140 may be the metal n (Mn). Although only two conductive features and single one via are illustrated in FIG. 13, the number of the conductive features and vias is not limited by the disclosure. In other embodiments, one or more conductive features and vias may be further disposed above the Mn and/or below the Mn-1. In addition, the conductive feature 108 may be electrically coupled to the device region 102.

It should be noted that the via 112 is disposed between the underlying conductive feature 108 and the overlying conductive feature 140, so as to be in direct contact with the underlying conductive feature 108 and the overlying conductive feature 140. That is, a contact interface 111 between the underlying conductive feature 108 and the via 112 is free of any barrier material, and a contact interface 113 between the overlying conductive feature 140 and the via 112 is free of any barrier material. As such, the contact resistance between the via 112 and the conductive features 108 and 140 decreases, thereby decreasing the RC delay and enhancing the device performance. On the other hands, the via 112 is formed by the electroless plating process and the conductive features 108 and 140 are formed by the electroplating process. Therefore, the via 112 may include an electroless plating metal, and the conductive features 108 and 140 may include an electroplating metal. In some embodiments, the electroless plating metal may be dense than the electroplating metal. Therefore, the contact interface 113 is actually present between the conductive feature 140 and the via 112 compared with the conventional dual damascene structure. On the other hands, the seed layer 144 may continuously extend on the contact interface 113 and separate the conductive layer 146 from the via 112 at the contact interface 113.

The interconnect structure 120 further includes the dielectric layers 104, 126, and 128. In some embodiments, the dielectric layers 104, 126, and 128 are collectively referred to as an inter-metal dielectric (IMD) layer which wraps or surrounds the conductive feature 108, 140, and the via 112. Unlike the etching stop layer in the conventional IMD layer with a dielectric constant greater than 4, the dielectric layers 104, 126, and 128 may include a low-k dielectric material with a dielectric constant less than 4. In the case, the IMD layer with the low-k dielectric material also can decrease the RC delay, thereby further enhancing the device performance.

The interconnect structure 120 further includes a barrier structure between the IMD layer and the conductive feature 108, 140, and between the IMD layer and the via 112. In detail, the barrier structure may include the barrier layers 106, 124, and 132. As shown in FIG. 13, the barrier layer 106 lines the sidewall and the bottom surface of the conductive feature 108. The barrier layer 124 (which may be called as lower barrier layer) lines the sidewall of the via 112 and extends to cover a portion of the top surface of the conductive feature 108 and the top surface of the dielectric layer 104. The barrier layer 124 continuously extends between two adjacent vias 112. The barrier layer 132 (which may be called as upper barrier layer) lines the sidewall and a portion of the bottom surface of the conductive feature 140. The barrier layers 106, 124, and 132 are connected to each other to constitute the barrier structure which may separate the conductive features 108 and 140 and the via 112 from the IMD layer. In the case, the barrier structure may prevent the metal atoms (e.g., Cu atoms) of the conductive features 108, 140, and/or the via 112 from diffusing into the IMD layer. In some embodiments, the barrier structure has a resistivity greater than a resistivity of the via 112, and greater than a resistivity of the conductive features 108 and 140. The barrier structure having the high resistivity is disposed to wrap the electrical path and not in the electrical path. As such, the electrical path of the interconnect structure may dramatically decrease the contact resistances as shrinking advanced IC technology nodes, thereby improving the device performance. The resistivity of the barrier structure (e.g., ALD TaN) may be greater than 5000 μΩ-cm (micro ohm-centimeter), and the resistivity of the via and/or the conductive feature may be less than that of the barrier structure.

According to some embodiments, a method of forming an interconnect structure includes forming a via; forming a first barrier layer to at least cover a top surface and a sidewall of the via; forming a first dielectric layer on the first barrier layer; performing a first planarization process to remove a portion of the first dielectric layer and a portion of the first barrier layer, thereby exposing the top surface of the via; forming a second dielectric layer on the first dielectric layer, wherein the second dielectric layer has an opening exposing the top surface of the via; forming a blocking layer on the top surface of the via; forming a second barrier layer on the second dielectric layer; removing the blocking layer to expose the top surface of the via; and forming a conductive feature in the opening, wherein the conductive feature is in contact with the top surface of the via. In some embodiments, the forming the via includes: forming a mask pattern having a via opening; and forming a conductive material in the via opening by using an electroless plating process. In some embodiments, the forming the via includes: forming a mask pattern having a via opening; forming a first conductive material in the via opening by using a first electroless plating process; and forming a second conductive material on the first conductive material by using a second electroless plating process, wherein the first and second conductive materials have different conductive materials. In some embodiments, the blocking layer includes a self-assembled monolayer (SAM), the SAM includes a molecular with a head group showing an affinity for a material of the via. In some embodiments, after forming the opening, the SAM is selectively adsorbed onto the top surface of the via by a vapor deposition process or a liquid deposition process, and free of adsorbing onto the second dielectric layer. In some embodiments, after forming the second barrier layer, the SAM is removed by a plasma process, a thermal process, or a wet etching process, so that the top surface of the via is exposed to the second barrier layer. In some embodiments, the forming the conductive feature in the opening includes: forming a seed material on the second barrier layer, wherein the seed material is in direct contact with the top surface of the via; forming a conductive material on the seed material to fill up the opening and extend to cover a top surface of the second dielectric layer; and performing a second planarization process to remove a portion of the conductive material, a portion of the seed material, and a portion of the second barrier layer, thereby exposing the top surface of the second dielectric layer.

According to some embodiments, a method of forming an interconnect structure including: forming a first conductive feature in a first dielectric layer; forming a second conductive feature on the first conductive feature; forming a via between the first and second conductive features, wherein the via is in direct contact with the first and second conductive features; and forming a barrier structure to line a sidewall and a portion of a bottom surface of the second conductive feature, a sidewall of the via, a portion of a top surface of the first conductive feature, and a top surface of the first dielectric layer. In some embodiments, the forming the via includes: forming a mask pattern having a via opening on the first dielectric layer, wherein the via opening exposes a portion of the first conductive feature; and forming a conductive material in the via opening by using an electroless plating process. In some embodiments, the forming the via includes: forming a mask pattern having a via opening on the first dielectric layer, wherein the via opening exposes a portion of the first conductive feature; forming a first conductive material in the via opening by using a first electroless plating process; and forming a second conductive material on the first conductive material by using a second electroless plating process, wherein the first and second conductive materials have different conductive materials. In some embodiments, after forming the via, the method further includes: forming a first barrier layer to continuously cover a top surface and a sidewall of the via, and a top surface of the first dielectric layer; forming a second dielectric layer on the first barrier layer; performing a first planarization process to remove a portion of the second dielectric layer and a portion of the first barrier layer, thereby exposing the top surface of the via; forming a third dielectric layer on the second dielectric layer, wherein the third dielectric layer has an opening exposing the top surface of the via; forming a blocking layer on the top surface of the via; forming a second barrier layer on the third dielectric layer, wherein the second barrier layer is connected to the first barrier layer to constitute the barrier structure; removing the blocking layer to expose the top surface of the via; and forming a conductive feature in the opening, wherein the conductive feature is in contact with the top surface of the via. In some embodiments, the blocking layer comprises a self-assembled monolayer (SAM), the SAM comprises a molecular with a head group showing an affinity for a material of the via. In some embodiments, after forming the opening, the SAM is selectively adsorbed onto the top surface of the via by a vapor deposition process or a liquid deposition process. In some embodiments, after forming the second barrier layer, the SAM is removed by a plasma process, a thermal process, or a wet etching process, so that the top surface of the via is exposed to the second barrier layer.

According to some embodiments, a method of forming an interconnect structure includes; forming a first conductive feature in a first dielectric layer; forming a via on the first conductive feature; forming a second dielectric layer to laterally wrap the via; forming a third dielectric layer on the second dielectric layer, wherein the third dielectric layer has a trench exposing the via; forming a blocking layer on the top surface of the via; forming an upper barrier layer on a region out of the blocking layer; removing the blocking layer to expose the top surface of the via; and forming a second conductive feature in the trench. In some embodiments, the forming the via includes: forming a mask pattern having a via opening; and forming a conductive material in the via opening by using an electroless plating process. In some embodiments, before forming the second dielectric layer, the method further includes: forming a barrier material to conformally cover a top surface of the first dielectric layer, a portion of a top surface of the first conductive feature, and the top surface and a sidewall of the via by using an atomic layer deposition (ALD) process; forming a dielectric material for forming the second dielectric layer on the barrier material; and performing a first planarization process to remove a portion of the dielectric material and a portion of the barrier material, thereby exposing the top surface of the via and forming a lower barrier layer. In some embodiments, after performing the first planarization process, the lower barrier layer has a top surface higher than the top surface of the via and higher than a top surface of the second dielectric layer. In some embodiments, the forming the via includes forming a first via and a second via side by side, the lower barrier layer continuously extends between the first and second vias. In some embodiments, the blocking layer includes a self-assembled monolayer (SAM), the SAM includes a molecular with a head group showing an affinity for a material of the via. In some embodiments, after forming the trench, the SAM is selectively adsorbed onto the top surface of the via by a vapor deposition process or a liquid deposition process, and free of adsorbing onto the third dielectric layer. In some embodiments, after forming the upper barrier layer, the SAM is removed by a plasma process, a thermal process, or a wet etching process, so that the top surface of the via is exposed to the upper barrier layer. In some embodiments, the forming the second conductive feature in the trench includes: forming a seed material on the upper barrier layer, wherein the seed material is in direct contact with the top surface of the via; forming a conductive material on the seed material to fill up the trench and extend to cover a top surface of the third dielectric layer; and performing a second planarization process to remove a portion of the conductive material, a portion of the seed material, and a portion of the upper barrier layer, thereby exposing the top surface of the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect structure, comprising:
    forming a via;
    forming a first barrier layer to at least cover a top surface and a sidewall of the via;
    forming a first dielectric layer on the first barrier layer;
    performing a first planarization process to remove a portion of the first dielectric layer and a portion of the first barrier layer, thereby exposing the top surface of the via;
    forming a second dielectric layer on the first dielectric layer, wherein the second dielectric layer has an opening exposing the top surface of the via;
    forming a blocking layer on the top surface of the via;
    forming a second barrier layer on the second dielectric layer, wherein the second barrier layer covers a top surface of the first barrier layer and is connected to the first barrier layer to constitute a barrier structure;
    removing the blocking layer to expose the top surface of the via; and
    forming a conductive feature in the opening, wherein the conductive feature is in contact with the top surface of the via, wherein the barrier structure completely covers a sidewall and a portion of a bottom surface of the conductive feature, the sidewall of the via, a portion of a bottom surface of the first dielectric layer, wherein the forming the conductive feature in the opening comprises:
        forming a seed material on the second barrier layer, wherein the seed material is in direct contact with the top surface of the via;
        forming a conductive material on the seed material to fill up the opening and extend to cover a top surface of the second dielectric layer; and
        performing a second planarization process to remove a portion of the conductive material, a portion of the seed material, and a portion of the second barrier layer, thereby exposing the top surface of the second dielectric layer.

2. The method of claim 1, wherein the forming the via comprises:
    forming a mask pattern having a via opening; and
    forming a conductive material in the via opening by using an electroless plating process.

3. The method of claim 1, wherein the forming the via comprises:
    forming a mask pattern having a via opening;
    forming a first conductive material in the via opening by using a first electroless plating process; and
    forming a second conductive material on the first conductive material by using a second electroless plating process, wherein the first and second conductive materials have different conductive materials.

4. The method of claim 1, wherein the blocking layer comprises a self-assembled monolayer (SAM), the SAM comprises a molecular with a head group showing an affinity for a material of the via.

5. The method of claim 4, wherein after forming the opening, the SAM is selectively adsorbed onto the top surface of the via by a vapor deposition process or a liquid deposition process, and free of adsorbing onto the second dielectric layer.

6. The method of claim 4, wherein after forming the second barrier layer, the SAM is removed by a plasma process, a thermal process, or a wet etching process, so that the top surface of the via is exposed to the second barrier layer.

7. A method of forming an interconnect structure, comprising:
    forming a first conductive feature in a first dielectric layer;
    forming a via on the first conductive feature;
    forming a first barrier layer to continuously cover a top surface and a sidewall of the via, and a top surface of the first dielectric layer;
    forming a second dielectric layer on the first barrier layer;
    performing a first planarization process to remove a portion of the second dielectric layer and a portion of the first barrier layer, thereby exposing the top surface of the via;
    forming a third dielectric layer on the second dielectric layer, wherein the third dielectric layer has an opening exposing the top surface of the via;
    forming a second barrier layer on the third dielectric layer, wherein the second barrier layer covers a top surface of the first barrier layer and is connected to the first barrier layer to constitute a barrier structure; and
    forming a second conductive feature in the opening, wherein the via is disposed between and in direct contact with the first and second conductive features,
    wherein the barrier structure completely covers a sidewall and a portion of a bottom surface of the second conductive feature, the sidewall of the via, a portion of a top surface of the first conductive feature, and the top surface of the first dielectric layer.

8. The method of claim 7, wherein the forming the via comprises:
    forming a mask pattern having a via opening on the first dielectric layer, wherein the via opening exposes a portion of the first conductive feature; and
    forming a conductive material in the via opening by using an electroless plating process.

9. The method of claim 7, wherein the forming the via comprises:
    forming a mask pattern having a via opening on the first dielectric layer, wherein the via opening exposes a portion of the first conductive feature;
    forming a first conductive material in the via opening by using a first electroless plating process; and
    forming a second conductive material on the first conductive material by using a second electroless plating process, wherein the first and second conductive materials have different conductive materials.

10. The method of claim 7, further comprising:
    forming a blocking layer on the top surface of the via after forming the third dielectric layer; and
    removing the blocking layer to expose the top surface of the via after forming the second barrier layer.

11. The method of claim 10, wherein the blocking layer comprises a self-assembled monolayer (SAM), the SAM comprises a molecular with a head group showing an affinity for a material of the via.

12. The method of claim 11, wherein after forming the opening, the SAM is selectively adsorbed onto the top surface of the via by a vapor deposition process or a liquid deposition process.

13. The method of claim 11, wherein after forming the second barrier layer, the SAM is removed by a plasma process, a thermal process, or a wet etching process, so that the top surface of the via is exposed to the second barrier layer.

14. The method of claim 7, wherein the barrier structure is a continuous structure and has the same material comprising Ti, TiN, Ta, TaN, or a combination thereof.

15. A method of forming an interconnect structure, comprising:
forming a first conductive feature in a first dielectric layer;
forming a via on the first conductive feature, wherein the via has a bottom surface in direct contact with a first portion of a top surface of the first conductive feature;
forming a lower barrier layer covering a sidewall of the via, a second portion of the top surface of the first conductive feature, and a top surface of the first dielectric layer;
forming a second dielectric layer on the lower barrier layer to laterally wrap the via;
forming a third dielectric layer on the second dielectric layer, wherein the third dielectric layer has a trench exposing the via;
forming a blocking layer on a top surface of the via;
forming an upper barrier layer on a region out of the blocking layer, the upper barrier layer covers a top surface of the lower barrier layer and is connected to the lower barrier layer to constitute a barrier structure;
removing the blocking layer to expose the top surface of the via; and
forming a second conductive feature in the trench, wherein the barrier structure covers a sidewall and a portion of a bottom surface of the second conductive feature, the sidewall of the via, a portion of a top surface of the first conductive feature and the top surface of the first dielectric layer, wherein the forming the second conductive feature in the trench comprises:
forming a seed material on the upper barrier layer, wherein the seed material is in direct contact with the top surface of the via;
forming a conductive material on the seed material to fill up the trench and extend to cover a top surface of the third dielectric layer; and
performing a second planarization process to remove a portion of the conductive material, a portion of the seed material, and a portion of the upper barrier layer, thereby exposing the top surface of the third dielectric layer.

16. The method of claim 15, wherein before forming the second dielectric layer, the method further comprises:
forming a barrier material to conformally cover the top surface of the first dielectric layer, the portion of the top surface of the first conductive feature, and the top surface and the sidewall of the via by using an atomic layer deposition (ALD) process;
forming a dielectric material for forming the second dielectric layer on the barrier material; and
performing a first planarization process to remove a portion of the dielectric material and a portion of the barrier material, thereby exposing the top surface of the via and forming the lower barrier layer.

17. The method of claim 15, wherein the blocking layer comprises a self-assembled monolayer (SAM), the SAM comprises a molecular with a head group showing an affinity for a material of the via.

18. The method of claim 17, wherein after forming the trench, the SAM is selectively adsorbed onto the top surface of the via by a vapor deposition process or a liquid deposition process, and free of adsorbing onto the third dielectric layer.

19. The method of claim 17, wherein after forming the upper barrier layer, the SAM is removed by a plasma process, a thermal process, or a wet etching process, so that the top surface of the via is exposed to the upper barrier layer.

20. The method of claim 15, wherein the barrier structure is a continuous structure and has the same material comprising Ti, TiN, Ta, TaN, or a combination thereof.

* * * * *